(12) United States Patent
Arimoto et al.

(10) Patent No.: US 9,244,231 B2
(45) Date of Patent: Jan. 26, 2016

(54) OPTICAL DEVICE HAVING A SUBSTRATE AND A LASER UNIT THAT EMITS LIGHT INTO THE SUBSTRATE

(71) Applicant: Oclaro Japan, Inc., Kanagawa (JP)

(72) Inventors: Hideo Arimoto, Tokyo (JP); Koichiro Adachi, Tokyo (JP); Misuzu Sagawa, Tokyo (JP); Takanori Suzuki, Tokyo (JP); Hiroyasu Sasaki, Kanagawa (JP)

(73) Assignee: OCLARO JAPAN, INC., Kanagawa (JP)

( * ) Notice: Subject to any disclaimer, the term of this patent is extended or adjusted under 35 U.S.C. 154(b) by 0 days.

(21) Appl. No.: 14/091,365

(22) Filed: Nov. 27, 2013

(65) Prior Publication Data
US 2014/0153605 A1     Jun. 5, 2014

(30) Foreign Application Priority Data

Nov. 30, 2012    (JP) ................. 2012-262503

(51) Int. Cl.
H01S 5/026     (2006.01)
G02B 6/42      (2006.01)
H01S 5/12      (2006.01)
H01S 5/18      (2006.01)

(52) U.S. Cl.
CPC ............ *G02B 6/4214* (2013.01); *G02B 6/4206* (2013.01); *H01S 5/0267* (2013.01); *G02B 6/4249* (2013.01); *H01S 5/12* (2013.01); *H01S 5/18* (2013.01)

(58) Field of Classification Search
CPC ......... H01S 5/12; H01S 5/18; H01S 5/50267; G02B 6/4214
See application file for complete search history.

(56) References Cited

U.S. PATENT DOCUMENTS

| | | | | |
|---|---|---|---|---|
| 2002/0131465 | A1* | 9/2002 | Lo et al. | 372/50 |
| 2003/0007749 | A1* | 1/2003 | Hurt et al. | 385/88 |
| 2006/0239605 | A1* | 10/2006 | Palen et al. | 385/14 |
| 2006/0239612 | A1 | 10/2006 | De Dobbelaere et al. | |
| 2008/0266638 | A1 | 10/2008 | Shinoda et al. | |
| 2009/0129421 | A1* | 5/2009 | Kitatani et al. | 372/50.23 |
| 2010/0265983 | A1* | 10/2010 | Adachi et al. | 372/50.23 |

FOREIGN PATENT DOCUMENTS

JP    2008-277445 A    11/2008

OTHER PUBLICATIONS

Frederik Van Laere, et. al., Journal of Lightwave Technology, vol. 25, No. 1, Jan. 2007, pp. 151-156.
Christopher R. Doerr et al., IEEE Photonics Technology Letters, vol. 22, No. 19, Oct. 1, 2010, pp. 1461-1463.

* cited by examiner

*Primary Examiner* — Jessica Stultz
*Assistant Examiner* — Marcia Golub-Miller
(74) *Attorney, Agent, or Firm* — Mattingly & Malur, PC

(57) ABSTRACT

An optical device includes a first substrate, having first and second surfaces, and a second substrate having a third surface. The first substrate includes: a laser unit, having an active layer and emitting light into the first substrate from the active layer; a reflecting mirror, having a plane obliquely intersecting an optical axis of light emitted from the laser unit, and being formed on the first surface so as to reflect the light toward the second surface; and a convex lens, being formed in a region on the second surface, the region including an optical axis of the light reflected by the reflecting mirror. The second substrate is provided with a grating coupler and an optical waveguide on the third surface, the optical waveguide having light incident on the grating coupler propagating therethrough.

3 Claims, 16 Drawing Sheets

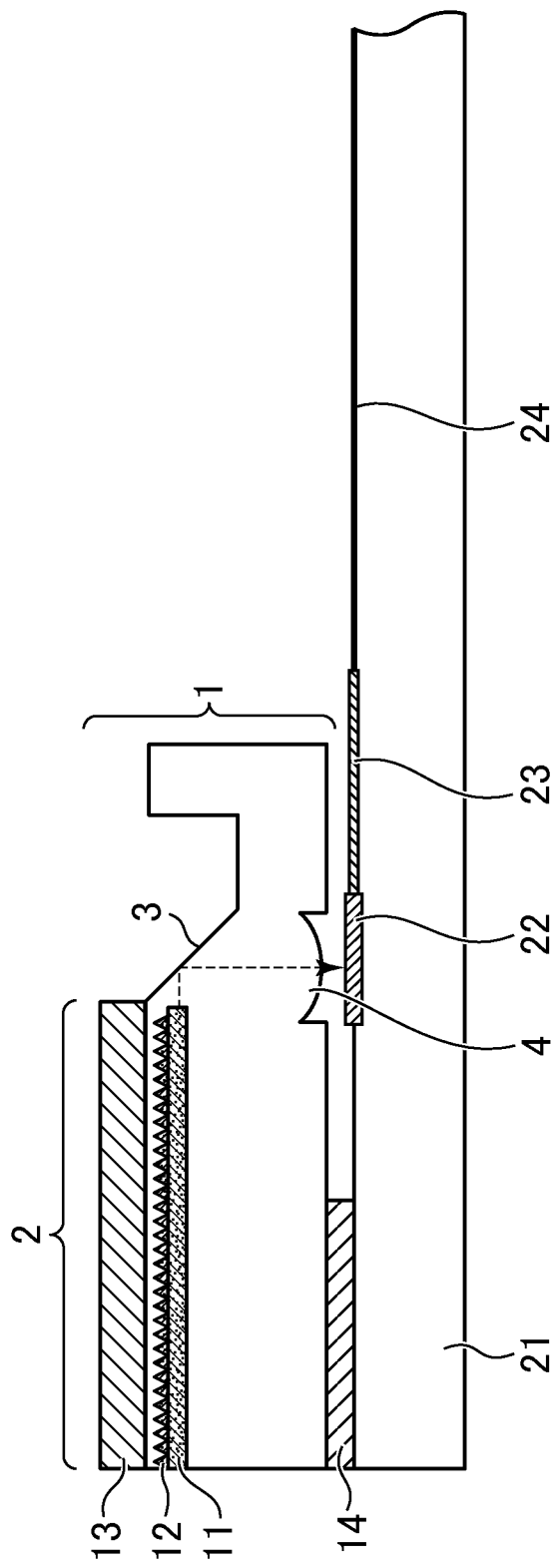

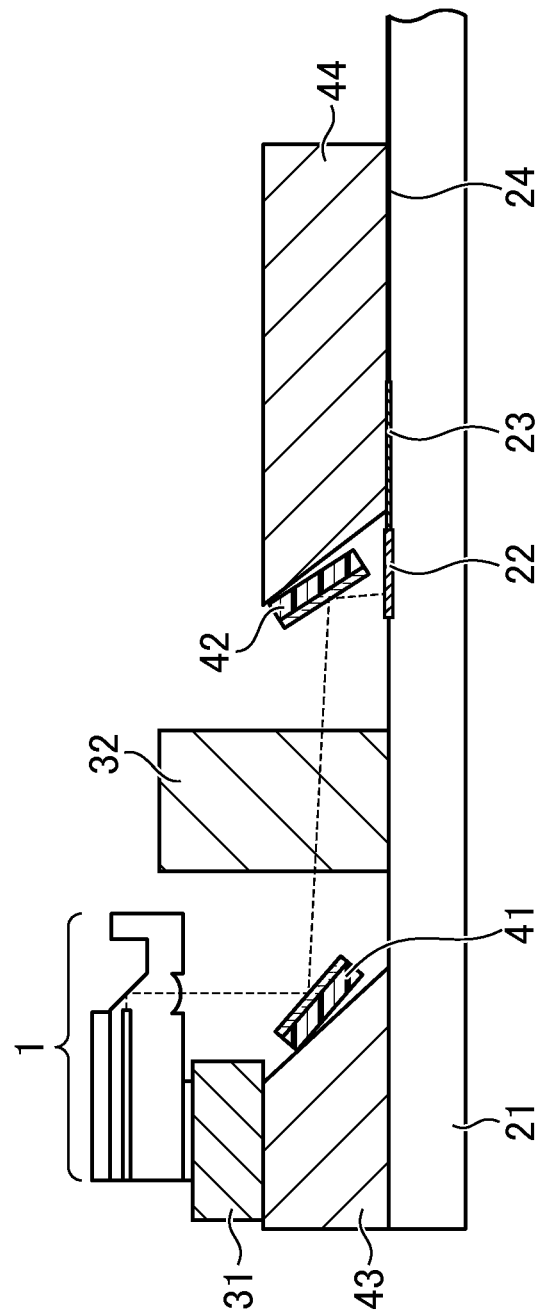

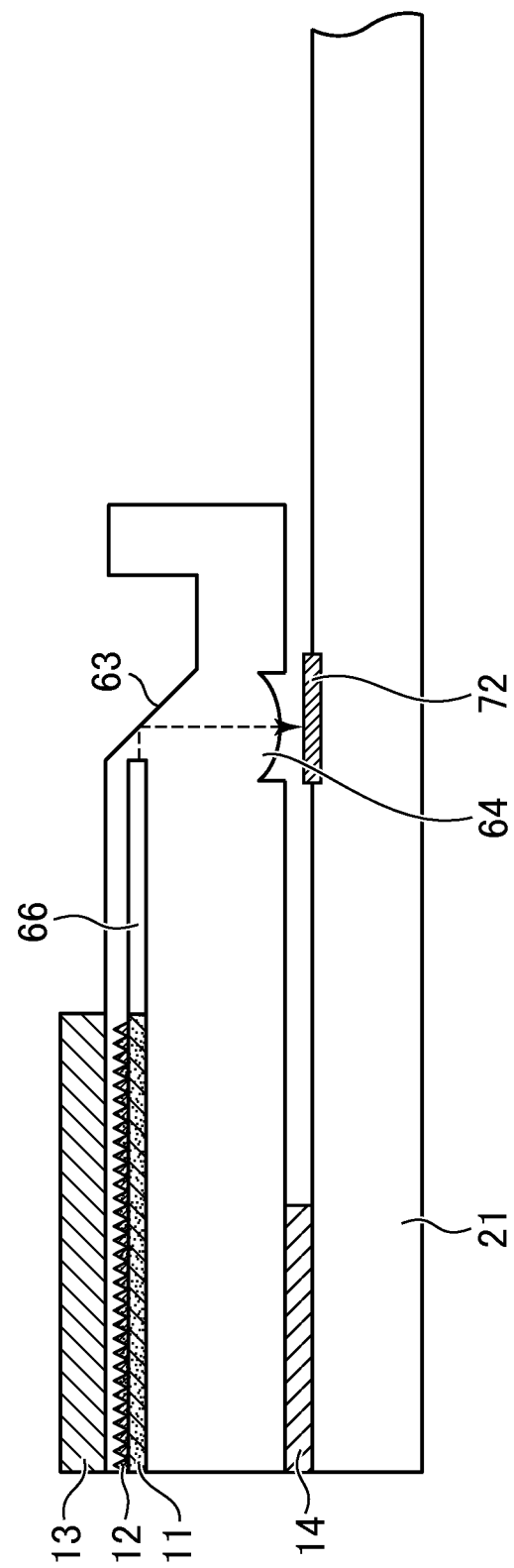

OPTICAL DEVICE HAVING A SUBSTRATE AND A LASER UNIT THAT EMITS LIGHT INTO THE SUBSTRATE

CROSS-REFERENCE TO RELATED APPLICATION

The present application claims priority from Japanese application JP 2012-262503 filed on Nov. 30, 2012, the content of which is hereby incorporated by reference into this application.

BACKGROUND OF THE INVENTION

1. Field of the Invention

The present invention relates to an optical device.

2. Description of the Related Art

Interconnection capacity within an information device such as a router or a server is increasing yearly. In the related art, although electrical interconnection has been used, it is preferable to use optical interconnection in order to realize further capacity enlargement. As one of techniques for realizing optical interconnection, silicon photonics is being developed. In order to realize the silicon photonics, a material which is capable of crystal growth on a silicon substrate and capable of laser oscillation is desired, but such a material is not known on a practical level.

SUMMARY OF THE INVENTION

In silicon photonics, the integration of a light source is a major problem. In the related art, a light source for silicon photonics is disclosed in US 2006/0239612 A1. The light source is an optical device in which a Group III-V semiconductor laser having a reflecting mirror on a surface thereof is flip-chip mounted on a silicon substrate to be coupled to a grating coupler on the silicon substrate. However, in this structure, since emission light from a laser spreads out, it is not possible to couple the emission light from the laser to the grating coupler with high efficiency. It is possible to parallelize emission light from a laser by interposing a lens between a surface emission type laser and a grating coupler. However, it is difficult to form the lens on the same surface side of a substrate. This is because an ordinary laser is formed to have a depth of approximately 2 μm from a surface, whereas the depth of the lens reaches 15 μm. For this reason, the lens is formed separately from the laser, which leads to a difficulty in performing mounting position adjustment between a laser unit and the lens with a high level of accuracy, to an increase in manufacturing costs, and to inhibition of miniaturization in an optical device including the surface emission type laser and the lens.

The present invention is contrived in view of such situations, and an object thereof is to provide an optical device which includes a semiconductor laser, a lens, and a grating coupler and is easily manufactured with a small number of components.

(1) In order to solve the above-mentioned problem, an optical device according to the present invention includes a first substrate and a second substrate. The first substrate is formed of a semiconductor material, has a first surface and a second surface which is a rear surface of the first surface. The first substrate includes a laser unit which has an active layer laminated between the first surface and the second surface and emits light into the first substrate from the active layer; a reflecting mirror which has a plane obliquely intersecting an optical axis of light emitted from the laser unit and propagating, and is formed on the first surface so as to reflect the light emitted from the laser unit and propagating, toward the second surface; and a convex lens which is formed in a region on the second surface, the region including an optical axis of the light reflected by the reflecting mirror. The second substrate has a third surface facing the second surface, and is provided with a grating coupler and an optical waveguide on the third surface thereof, the optical waveguide having light incident on the grating coupler propagating therethrough.

(2) In the optical device according to (1) mentioned above, the convex lens may converge or parallelize the light reflected by the reflecting mirror so as to cause the light to reach the grating coupler.

(3) In the optical device according to (2) mentioned above, the optical axis of the light reflected by the reflecting mirror may be shifted to an opposite side to the optical waveguide side of the second substrate from an axis penetrating a center of the convex lens, and may penetrate a surface of the convex lens.

(4) In the optical device according to (2) or (3) mentioned above, an angle between the optical axis of the light and a normal line of the reflecting mirror may be greater than 45 degrees, wherein the light is emitted from the laser unit, propagates, and reaches the reflecting mirror.

(5) The optical device according to any one of (1) to (4) mentioned above may further include an isolator which is disposed between the first substrate and the second substrate and on a light path of light, to reach the grating coupler after having passed through the convex lens.

(6) The optical device according to (1) mentioned above may further include a first angle variable reflecting mirror, located between the first substrate and the second substrate, which reflects light having passed through the convex lens; and a second angle variable reflecting mirror which reflects the light reflected by the first angle variable reflecting mirror so as to cause the light to reach the grating coupler.

(7) The optical device according to (6) mentioned above may further include an isolator which is disposed on a light path of the light, to reach the second angle variable reflecting mirror after being reflected by the first angle variable reflecting mirror.

(8) In the optical device according to (3) mentioned above, a shift of the optical axis of the light reflected by the reflecting mirror with respect to the axis penetrating the center of the convex lens may be equal to or less than 18 μm.

(9) In the optical device according to (4) mentioned above, the formed angle may be equal to or less than 48 degrees.

(10) In the optical device according to (1) mentioned above, the first substrate may include a plurality of integrated laser element units having the laser unit, the reflecting mirror, and the convex lens. A plurality of integrated waveguide circuit units including the grating coupler and the optical waveguide may be formed in the second substrate. Light having passed through the convex lens of each of the integrated laser element units may be incident on the grating coupler of the corresponding integrated waveguide circuit unit.

(11) The optical device according to (10) mentioned above may further include an isolator which is disposed between the first substrate and the second substrate and over light paths of light beams, to reach the grating couplers of the corresponding integrated waveguide circuit units after having passed through the convex lenses of the plurality of integrated laser element units.

(12) In the optical device according to (1) mentioned above, the first substrate may include a plurality of integrated laser element units having the laser unit and a laser optical waveguide for propagating the light emitted from the laser unit to the reflecting mirror. Wavelengths of the light beams emitted from the laser units of the plurality of integrated laser element units may be different from each other. Optical axes of light beams, propagating through the laser optical waveguides of the plurality of integrated laser element units and reflected by the reflecting mirror, may be shifted to an opposite side to the optical waveguide side of the second substrate from an axis penetrating a center of the convex lens, and may penetrate a surface of the convex lens.

(13) In the optical device according to any one of (1) to (12) mentioned above, the second substrate may be formed of any one material of Si, GaAs, InP, and glass.

According to the present invention, provided is an optical device which includes a semiconductor laser, a lens, and a grating coupler and is easily manufactured with a small number of components.

BRIEF DESCRIPTION OF THE DRAWINGS

FIG. 1B is a cross-sectional view of the optical device according to the first embodiment of the present invention.

FIG. 7 is a cross-sectional view of an optical device according to a fifth embodiment of the present invention.

FIG. 9B is a cross-sectional view of the optical device according to the seventh embodiment of the present invention.

DETAILED DESCRIPTION OF THE INVENTION

Figure 1A:
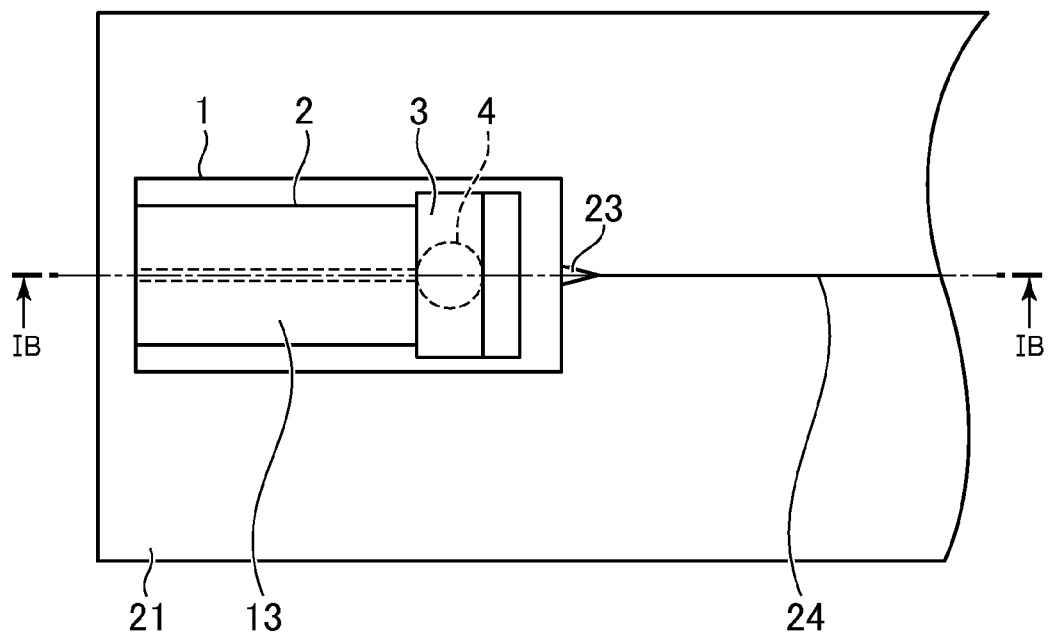
FIG. 1A is a top view of an optical device according to a first embodiment of the present invention.

Hereinafter, embodiments of the present invention will be described specifically and in detail with reference to the accompanying drawings. Meanwhile, in all diagrams for illustrating the embodiments, members having the same function are denoted by the same reference numeral, and a description thereof will not be repeated. In addition, the following diagrams are merely for illustrating examples of the embodiments, and the size of the diagram and a reduced size described in this example are not necessarily consistent with each other.

First Embodiment

FIG. 1A is a top view of an optical device according to a first embodiment of the present invention. The optical device according to this embodiment includes a first semiconductor substrate (first substrate) and a second semiconductor substrate (second substrate). The first semiconductor substrate (semiconductor laser element 1) includes a DFB laser unit 2, a reflecting mirror 3, and a convex lens 4. That is, the semiconductor laser element 1 is a semiconductor optical device in which the DFB laser unit 2, the reflecting mirror 3, and the convex lens 4 are integrated on the first semiconductor substrate. Meanwhile, the DFB laser, which is a distributed-feedback laser, is formed on an InP substrate. That is, here, a semiconductor material of the first substrate is InP, but the present invention is not limited thereto. The first substrate may be a substrate formed of another semiconductor material. In addition, the second semiconductor substrate is a silicon substrate 21, and a grating coupler 22 and an optical waveguide are formed on a surface of the silicon substrate 21 as described later.

FIG. 1B is a cross-sectional view of the optical device according to this embodiment, and shows a cross-section along line IB-IB illustrated in FIG. 1A. The first semiconductor substrate has a first surface which is an upper surface illustrated in FIG. 1B, and a second surface which is a lower surface illustrated in FIG. 1B, and the second surface is a rear surface with respect to the first surface. The DFB laser unit 2 includes an active layer 11 that generates a gain, and a diffraction grating 12. The active layer 11 is laminated between the first surface and the second surface, and emits light into the first semiconductor substrate from an end of the active layer 11. In the first semiconductor substrate (semiconductor laser element 1), an upper electrode 13 (surface electrode) is formed on the first surface of the DFB laser unit 2, and a lower electrode 14 (rear electrode) is formed on the second surface thereof, and thus it is possible to inject a current into the active layer 11 by the upper electrode 13 and the lower electrode 14.

The light emitted into the first semiconductor substrate from the end by the DFB laser unit 2 propagates through the first semiconductor substrate in a right direction of FIG. 1B and reaches the reflecting mirror 3. The reflecting mirror 3 is configured such that a semiconductor positioned below the first surface (upper surface) of the first semiconductor substrate is removed, and that a plane obliquely intersecting the optical axis of the light reaching the reflecting mirror 3 is formed. That is, the reflecting mirror 3 is formed on the first surface, and the plane of the reflecting mirror 3 is a portion of the first surface. A normal line of the plane of the reflecting mirror 3 obliquely interests the optical axis of the light reaching the reflecting mirror 3 at 45 degrees, and thus the reflecting mirror 3 reflects the light in a downward direction of FIG. 1B. That is, the reflecting mirror 3 reflects the light toward the second surface (lower surface).

The light reflected by the reflecting mirror 3 propagates through the first semiconductor substrate in a downward direction of FIG. 1B and reaches the convex lens 4. The convex lens 4 is configured such that a semiconductor positioned below the second surface (lower surface) of the first semiconductor substrate is removed, and that a convex curve surface is formed. The convex lens 4 is formed in a region, which is the second surface, including the optical axis of the light reflected by the reflecting mirror 3. The convex lens 4 converges or parallelizes the light reflected by the reflecting mirror 3 so as to cause the light to reach the grating coupler 22 which is to be described later. In FIG. 1B, the optical axis of the light emitted from the DFB laser unit 2, reflected by the reflecting mirror 3, passing through the convex lens 4, and reaching the grating coupler 22 is illustrated as a broken line, and the optical axis of the light passing through the convex lens 4 penetrates the center of the convex lens 4. Here, the diameter of the convex lens 4 is 90 μm, and the radius of curvature of a lens surface is 125 μm. The semiconductor laser element 1 is manufactured using, for example, a manufacturing method disclosed in JP 2008-277445 A.

Figure 1C:
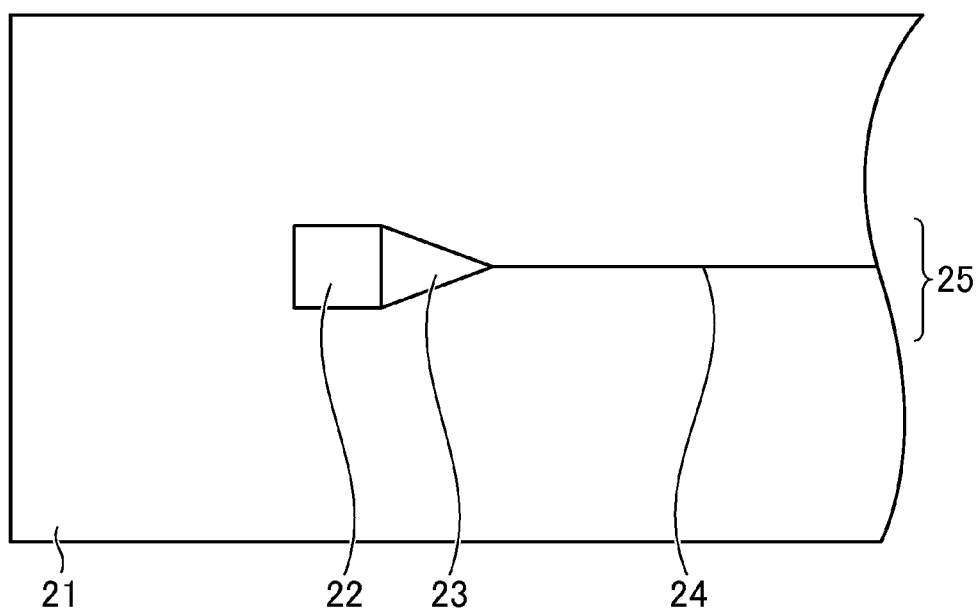
FIG. 1C is a top view of a silicon substrate of the optical device according to the first embodiment of the present invention.

FIG. 1C is a top view of the silicon substrate 21 (second semiconductor substrate) of the optical device according to this embodiment. The silicon substrate 21 has a third surface which is an upper surface illustrated in FIG. 1B, and the third surface is disposed so as to face the second surface (lower surface) of the first semiconductor substrate. In the optical device according to this embodiment, the semiconductor laser element 1 is directly mounted onto the silicon substrate 21. The grating coupler 22, a first optical waveguide 23, and a second optical waveguide 24 are formed on the third surface of the silicon substrate 21. Meanwhile, the grating coupler 22 and the optical waveguides (first optical waveguide 23 and second optical waveguide 24) will be collectively referred to as an integrated waveguide circuit unit 25. The grating coupler 22 is an element for coupling light having passed through the convex lens 4 of the semiconductor laser element 1. The first optical waveguide 23 is disposed so as to come into contact with the right side of the grating coupler 22 of FIG. 1C, and has a shape (triangular shape) in which a width thereof decreases toward the right side. The light coupled in the grating coupler 22 propagates through the first optical waveguide 23, and then propagates to the second optical waveguide 24 in a single mode. The second optical waveguide 24 disposed so as to come into contact with the first optical waveguide 23 and extending in a right direction of FIG. 1B and FIG. 1C is a waveguide that satisfies a single mode condition to stably guide light. Although not shown in the drawing, for example, a Mach-Zehnder (MZ) modulator, a grating coupler, and an optical fiber for transmitting light may be formed at the front where the second optical waveguide 24 extends.

The feature of the optical device according to the present invention is to include the semiconductor laser element 1 (first semiconductor substrate) having the reflecting mirror 3 and the convex lens 4 formed on the first surface and the second surface, respectively, and the second semiconductor substrate having the grating coupler 22 formed on the third surface. The light emitted from the DFB laser unit 2 is converged or parallelized by the convex lens 4 and then reaches the grating coupler 22, and thus the light can be coupled in the grating coupler 22 with high efficiency. The reflecting mirror 3 and the convex lens 4 are formed on the surface of the first semiconductor substrate, and thus a reduction in a number of components is realized as compared to a case where a reflecting mirror and a convex lens are formed separately from a laser, thereby allowing the optical device to be created through a simpler process. Therefore, it is possible to realize a reduction in manufacturing costs and miniaturization of the device.

Second Embodiment

An optical device according to a second embodiment of the present invention is different from that in the first embodiment in the arrangement of a convex lens 4, but the other structures are the same as those of the optical device according to the first embodiment. In the optical device according to the first embodiment, the axis penetrating the center of the convex lens 4 is consistent with the optical axis of the light reflected by the reflecting mirror 3 and reaching the convex lens 4. In contrast, in the optical device according to this embodiment, an optical axis of light reflected by a reflecting mirror 3 (optical axis of incident light on convex lens 4) is shifted to the opposite side to the optical waveguide side of a second semiconductor substrate from an axis which penetrates the center of the convex lens 4 (the optical axis of the convex lens 4), and penetrates the surface of the convex lens 4. Here, the phrase "the optical axis of the incident light on the convex lens 4 is shifted to the opposite side to the optical waveguide side from the optical axis of the convex lens 4, and penetrates the surface of the convex lens 4" as used herein is as described below. The optical waveguides formed on a third surface of the second semiconductor substrate are a first optical waveguide 23 and a second optical waveguide 24. The first optical waveguide 23 comes into contact with the right side of the grating coupler 22 of FIG. 1C, and the second optical waveguide 24 further extends to the right side of FIG. 1C. Therefore, this means that the optical axis of the incident light on the convex lens 4 is shifted to the left side of FIG. 1C from the optical axis of the convex lens 4 and penetrates the surface of the convex lens 4. Meanwhile, it is preferable that both the optical axis of the convex lens 4 and the optical axis of the incident light on the convex lens 4 are included in a plane, perpendicular to the third surface, which penetrates the second optical waveguide 24. However, both or either of the optical axis of the convex lens 4 or the optical axis of the incident light on the convex lens 4 may not be included in such a plane. Even in such a case, the optical axis of the incident light on the convex lens 4 may be shifted to the opposite side to the optical waveguide side from a plane, perpendicular to an extension direction of the second optical waveguide 24, which includes the optical axis of the convex lens 4, and may penetrate the surface of the convex lens 4.

Figure 2:
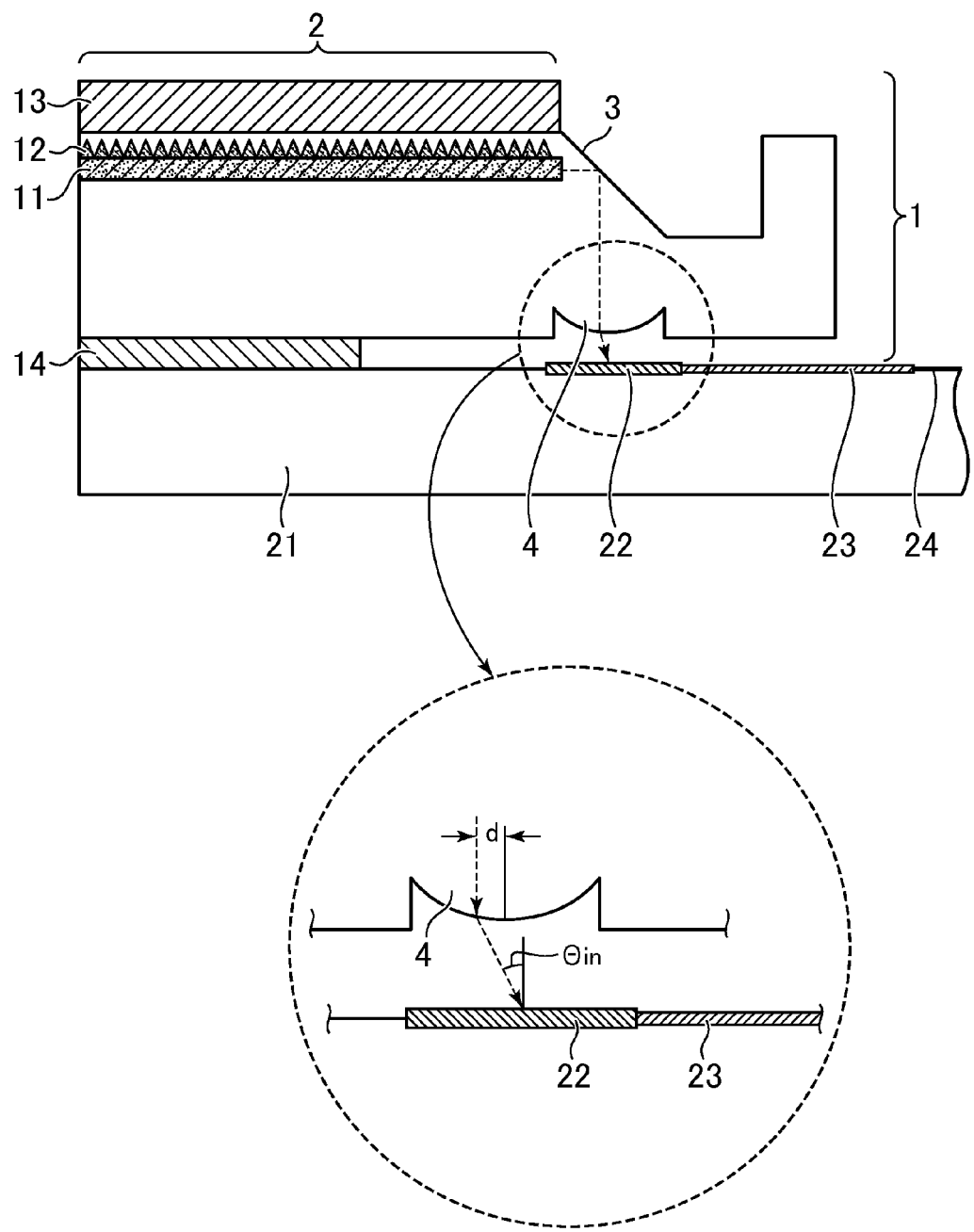
FIG. 2 is a cross-sectional view of an optical device according to a second embodiment of the present invention.

FIG. 2 is a cross-sectional view of the optical device according to this embodiment, and corresponds to the cross-section along line IB-IB illustrated in FIG. 1A. An enlarged view of a region of FIG. 2 which is surrounded by a broken line is shown on the lower side. Similarly to FIG. 1A, light reflected by the reflecting mirror 3 propagates in a downward direction of FIG. 2 and reaches the convex lens 4. In the optical device illustrated in FIG. 2, both the optical axis of the convex lens 4 and the optical axis of the incident light on the convex lens 4 are included in a plane, perpendicular to the third surface, which penetrates the second optical waveguide 24. The optical axis (broken line) of the incident light is shifted to the left side from the optical axis (solid line) of the convex lens 4, and the shift of the optical axis of the incident light on the convex lens 4 is d. The incident light on the convex lens 4 is shifted to the opposite side to the optical waveguide from the center of the convex lens 4, and thus the optical axis of the light having passed through the convex lens 4 is tilted to the axis side (to the right side of FIG. 2) of the center of the convex lens 4 from the optical axis of the incident light by the convex lens 4. Here, an angle between the optical axis of the light having passed through the convex lens 4 and a normal line of the third surface is set to an incidence angle $\Theta_{in}$.

Figure 3:
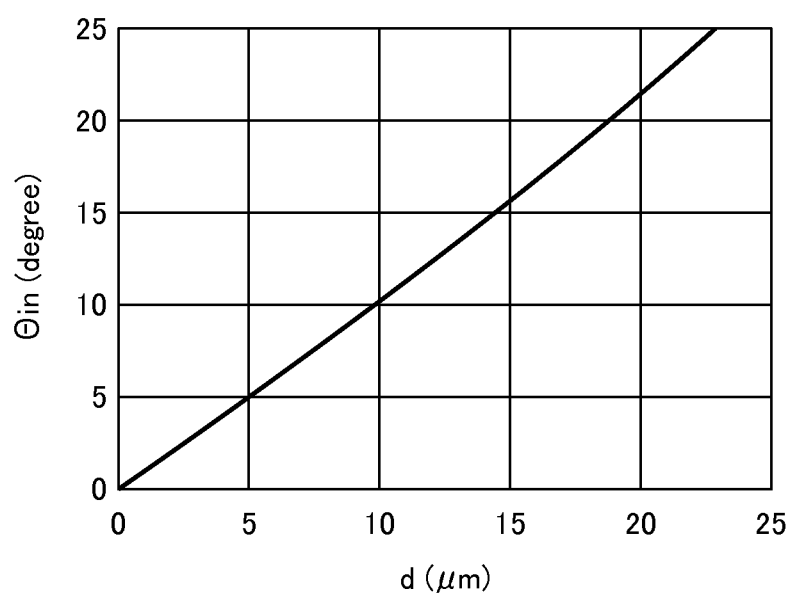
FIG. 3 is a diagram illustrating a relationship between a shift d of incident light on a convex lens and an incidence angle $\Theta_{in}$ of light on a grating coupler.

FIG. 3 is a diagram illustrating a relationship between the shift d of the incident light on the convex lens 4 and an incidence angle $\Theta_{in}$ of light on the grating coupler 22. When the light incident on the grating coupler 22 is tilted to the optical waveguide side in a normal direction, the coupling efficiency is enhanced. In particular, when the incidence angle $\Theta_{in}$ is equal to or less than 20 degrees, the coupling efficiency is high. At this time, the shift d of the optical axis of the incident light is 18 μm, and the shift d is preferably equal to or less than 18 μm. From the viewpoint of coupling efficiency, the incidence angle $\Theta_{in}$ is preferably equal to or less than 10 degrees±5 degrees (shift d is 5 μm to 14.5 μm), and is further preferably equal to or less than 10 degrees±2 degrees (shift d is 8 μm to 12 μm). Meanwhile, when the shift d is 10 μm, the incidence angle $\Theta_{in}$ is 10 degrees.

Third Embodiment

An optical device according to a third embodiment of the present invention has the same structure as the optical device according to the first embodiment except that a tilt of a plane of a reflecting mirror 3 is different from that in the first embodiment. In the optical device according to the first embodiment, the normal line of the plane of the reflecting mirror 3 obliquely intersects the optical axis of the light (incident light on the reflecting mirror 3) which reaches the reflecting mirror 3 at 45 degrees. On the other hand, in the optical device according to this embodiment, an angle between an optical axis of the light and a normal line of the reflecting mirror 3 is greater than 45 degrees, wherein the light is emitted from the DFB laser unit 2, propagates, and reaches the reflecting mirror 3.

Figure 4:
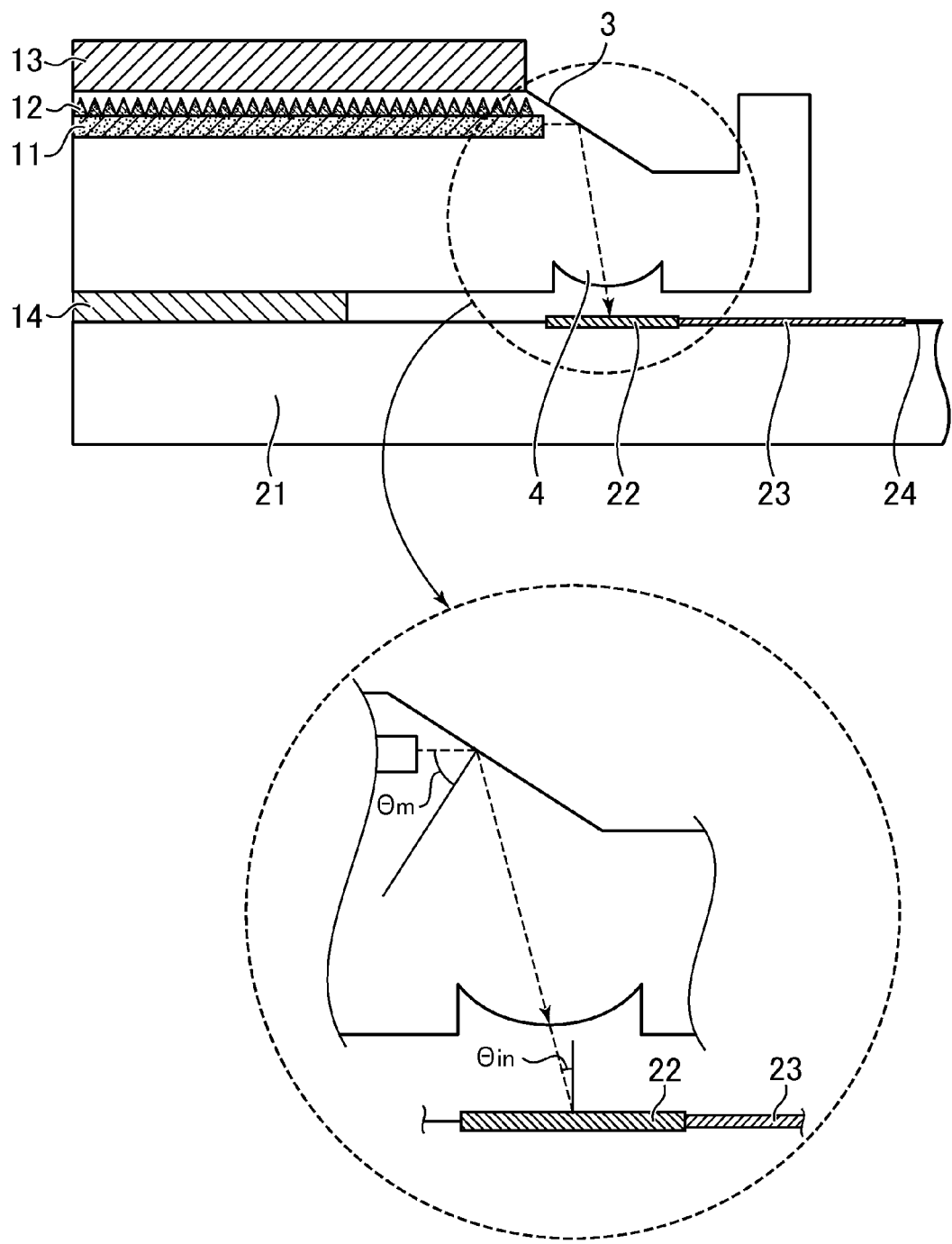
FIG. 4 is a cross-sectional view of an optical device according to a third embodiment of the present invention.

FIG. 4 is a cross-sectional view of the optical device according to this embodiment, and corresponds to the cross-section along line IB-IB illustrated in FIG. 1A. An enlarged view of a region of FIG. 4 which is surrounded by a broken line is shown on the lower side. An angle between an optical axis of light incident on a plane of the reflecting mirror 3 and the normal line of the reflecting mirror 3 is set to an incidence angle $\Theta_m$ of light on the reflecting mirror 3. Herein, since the incidence angle $\Theta_m$ of the light on the reflecting mirror 3 is greater than 45 degrees, the optical axis of the light reflected by the reflecting mirror 3 is tilted to the optical waveguide side from the normal line of the third surface. Herein, the optical axis of the light reflected by the reflecting mirror 3 penetrates the center of the convex lens 4, and thus an optical axis of the light having passed through the convex lens 4 is consistent with the optical axis of the light reflected by the reflecting mirror 3 without being refracted by the convex lens. Similarly to FIG. 2, an incidence angle of light on the grating coupler 22 is set to an incidence angle $\Theta_{in}$.

Figure 5:
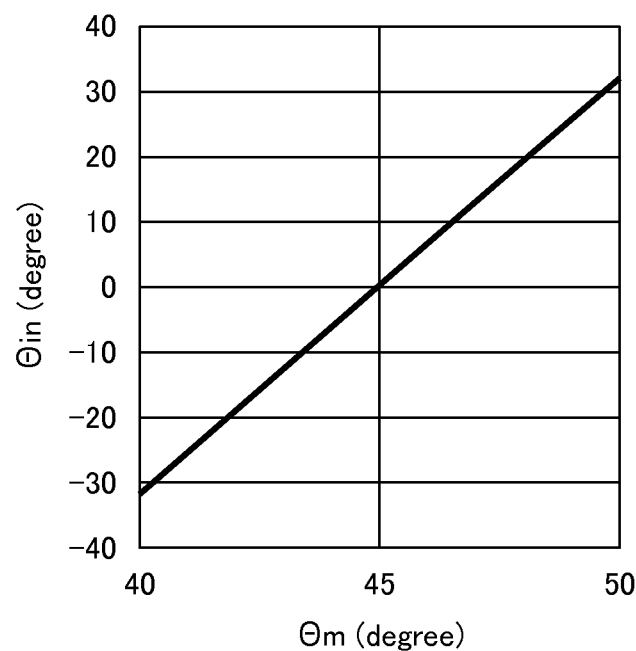
FIG. 5 is a diagram illustrating a relationship between an incidence angle $\Theta_m$ of light on a reflecting mirror and an incidence angle $\Theta_{in}$ of light on a grating coupler.

FIG. 5 is a diagram illustrating a relationship between the incidence angle $\Theta_m$ of the light on the reflecting mirror 3 and the incidence angle $\Theta_{in}$ of the light on the grating coupler 22. Similarly to the second embodiment, when the light incident on the grating coupler 22 is tilted to the optical waveguide side in a normal direction, the coupling efficiency is enhanced. In particular, when the incidence angle $\Theta_m$ is equal to or less than 48 degrees, the incidence angle $\Theta_{in}$ is greater than 0 degrees and is equal to or less than 20 degrees, which is preferable. From the viewpoint of coupling efficiency, the incidence angle $\Theta_{in}$ is preferably equal to or less than 10 degrees±5 degrees ($\Theta_m$ is 45.8 degrees to 47.3 degrees), and is further preferably equal to or less than 10 degrees±2 degrees ($\Theta_m$ is 46.2 degrees to 46.8 degrees). Meanwhile, when the incidence angle $\Theta_m$ is 46.5 degrees, the incidence angle $\Theta_{in}$ is 10 degrees, which is optimal.

Meanwhile, herein, the optical axis of the light reflected by the reflecting mirror 3 and incident on the convex lens 4 penetrates the center of the convex lens 4, but the present invention is not limited thereto. Similarly to the second embodiment, the optical axis of the light incident on the convex lens 4 may be shifted from the center of the convex lens 4 and penetrate the surface of the convex lens 4. In this case, the incidence angle $\Theta_{in}$ of the light on the grating coupler 22 is an angle in which a tilt caused by the reflection of the reflecting mirror 3 and a tilt caused by the refraction on the surface of the convex lens 4 are combined with each other in an overlapping manner. In addition, it is preferable that an incidence surface created by the optical axis of the light incident on the reflecting mirror 3 penetrates the second optical waveguide 24, but the present invention is not limited thereto. Even in this case, the optical axis of the light on the grating coupler 22 may be tilted to the optical waveguide side further than a plane, including a point penetrating the surface of the grating coupler 22, which is perpendicular to the extension direction of the second optical waveguide 24.

Fourth Embodiment

An optical device according to a fourth embodiment of the present invention is different from those in the first to third embodiments in that the optical device further includes an isolator 32 and accordingly additionally includes a holding member, but the other structures are the same as the optical device according to any of the first to third embodiments. The isolator 32 is disposed between a semiconductor laser element 1 (first semiconductor substrate) and a silicon substrate 21 (second semiconductor substrate) and on a light path of light, to reach a grating coupler 22 after having passed through a convex lens 4.

Figure 6A:
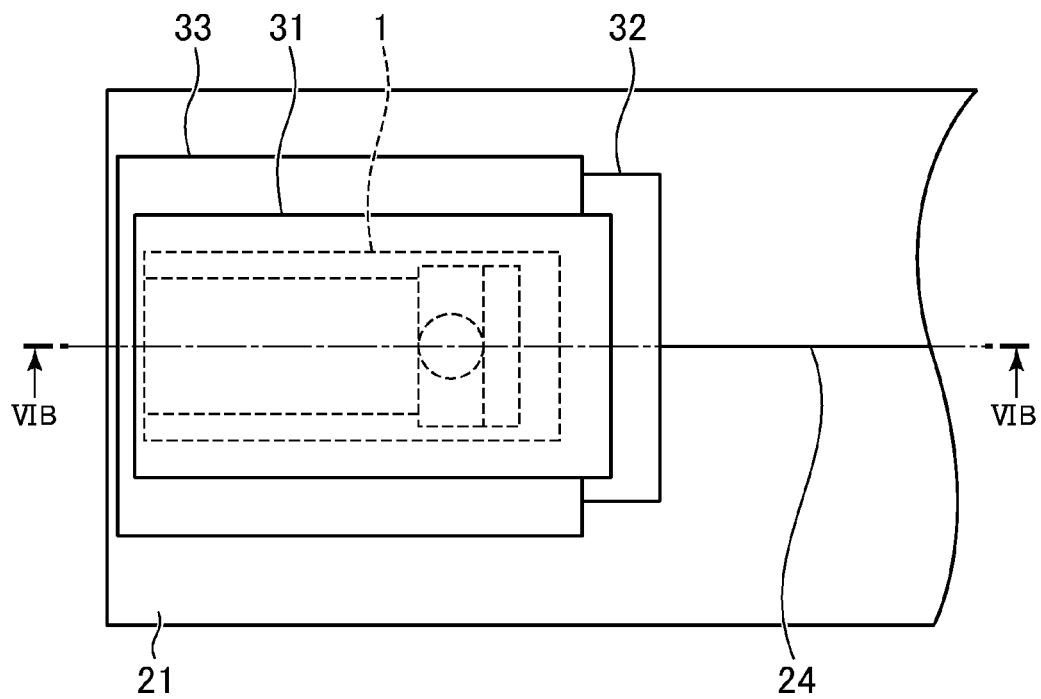
FIG. 6A is a top view of an optical device according to a fourth embodiment of the present invention.
Figure 6B:
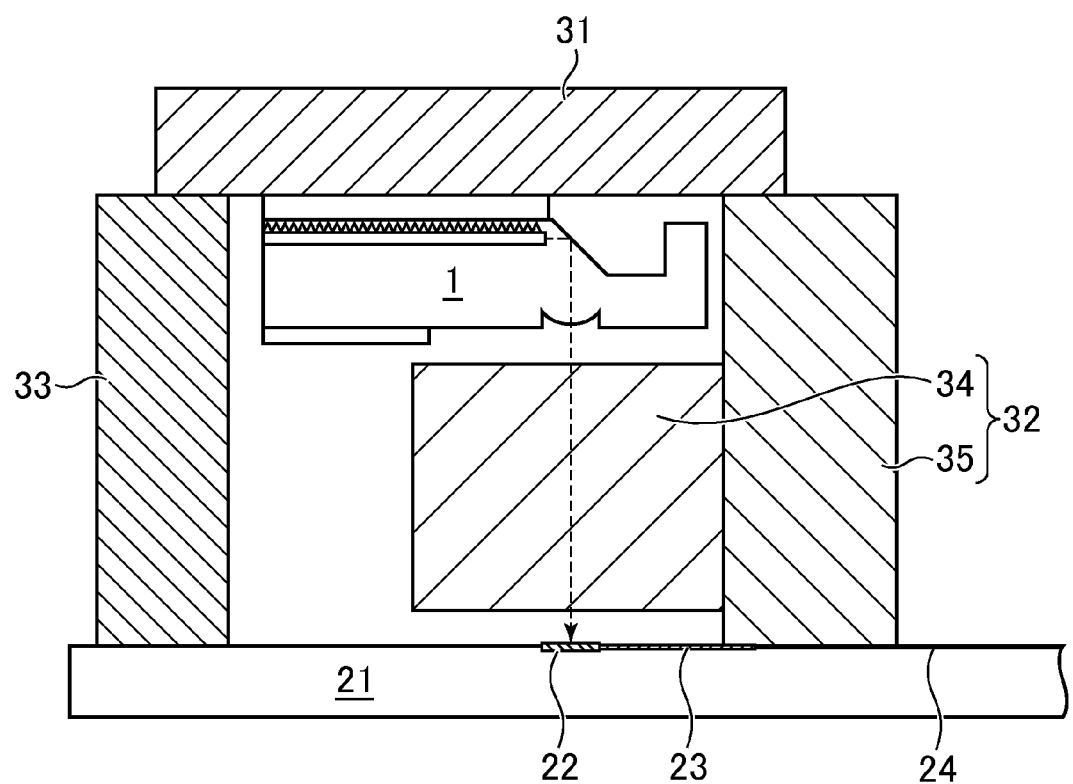
FIG. 6B is a cross-sectional view of the optical device according to the fourth embodiment of the present invention.

FIG. 6A is a top view of the optical device according to this embodiment. FIG. 6B is a cross-sectional view of the optical device according to this embodiment, and shows a cross-section along line VIB-VIB illustrated in FIG. 6A. The semiconductor laser element 1 and the silicon substrate 21 illustrated in FIG. 6B are the same as the semiconductor laser element 1 and the silicon substrate 21 according to the first embodiment. As illustrated in FIG. 6B, the optical device according to this embodiment further includes a laser submount 31, the isolator 32, and a U-shaped guide 33. The semiconductor laser element 1 is mounted to the laser submount 31, and is fixed to the laser submount 31 using an upper electrode 13 (surface electrode). The isolator 32 is constituted by an isolator chip 34 and an isolator magnet 35, and the isolator chip 34 is fixed to the isolator magnet 35. The U-shaped guide 33 and the isolator magnet 35 are fixed onto the silicon substrate 21, and the laser submount 31 having the semiconductor laser element 1 mounted thereto is fixed to the U-shaped guide 33 and the isolator magnet 35. That is, the isolator chip 34 of the isolator 32 is disposed between the convex lens 4 of the semiconductor laser element 1 and the grating coupler 22 of the silicon substrate 21. Meanwhile, the laser submount 31, the U-shaped guide 33, and the isolator magnet 35 are holding members for fixing the semiconductor laser element 1 and the isolator chip 34.

In the optical device according to this embodiment, the isolator 32 is disposed between the convex lens 4 and the grating coupler 22. Thus, even though reflected light propagates in a reverse direction from an optical waveguide on the silicon substrate 21 or an optical member (for example, optical fiber) before the optical waveguide, the isolator 32 can reduce the reflected light, and thus the intensity of the reflected light incident on the semiconductor laser element 1 is significantly attenuated, thereby exhibiting an additional effect such as a stabilized oscillation state of the optical device. By the isolator 32 being disposed, a distance between the convex lens 4 and the grating coupler 22 becomes longer than those in the first to third embodiments. When light emitted from the semiconductor laser element spreads out, the element size of the grating coupler is required to be increased with the increase in distance. However, in this embodiment, light emitted from the convex lens 4 by the semiconductor laser element 1 is converged or parallelized by the convex lens 4, and thus the mode radius of light incident on the grating coupler 22 is as small as approximately 20 μm. Therefore, even though light passes through the isolator 32 having a thickness of approximately 1.5 mm, the element size of the grating coupler 22 is not required to be increased as compared with the case of spread-out light, and thus the present invention has a pronounced effect.

Fifth Embodiment

An optical device according to a fifth embodiment of the present invention is different from that in the first embodiment in that the optical device further includes an isolator 32 and two angle variable reflecting mirrors 41 and 42 and accordingly additionally includes a holding member, but the other structures are the same as the optical device according to the first embodiment.

FIG. 7 is a cross-sectional view of the optical device according to this embodiment. Both the angle variable reflecting mirrors 41 and 42 are located between a semiconductor laser element 1 (first semiconductor substrate) and a silicon substrate 21 (second semiconductor substrate). The angle variable reflecting mirror 41 (first angle variable reflecting mirror) is disposed on an optical axis of light having passed through a convex lens 4 and reflects the light. The angle variable reflecting mirror 42 (second angle variable reflecting mirror) reflects the light reflected by the angle variable reflecting mirror 41 and causes the light to reach a grating coupler 22. Furthermore, the (isolator chip of) isolator 32 is disposed on a light path of the light, to reach the angle variable reflecting mirror 42 after being reflected by the angle variable reflecting mirror 41. The light reflected by the angle variable reflecting mirror 41 passes through the isolator 32 and is then incident on the angle variable reflecting mirror 42. Silicon substrates 43 and 44 for holding the angle variable reflecting mirrors 41 and 42, respectively, are fixed onto the silicon substrate 21. The semiconductor laser element 1 is fixed to a laser submount 31 using a lower electrode 14 (rear electrode), and the laser submount 31 having the semiconductor laser element 1 mounted thereto is fixed to a top surface of the silicon substrate 43.

Both the angle variable reflecting mirrors 41 and 42 have a micro electro mechanical systems (MEMS) structure, and are capable of adjusting an angle under its control. The light reflected by the second angle variable reflecting mirror 42 is incident on the grating coupler 22 formed on the silicon substrate 21. With respect to an incidence angle $\Theta_{in}$ of the light on the grating coupler 22, it is possible to perform optical-axis adjustment including angle adjustment by using the two angle variable reflecting mirrors 41 and 42. Therefore, there are pronounced effects that the mounting is facilitated because fine adjustment is not necessary when mounting the semiconductor laser element 1 to the optical device, and that it is also possible to perform angle adjustment even after the semiconductor laser element 1 is manufactured.

Herein, although the isolator 32 is disposed between the two angle variable reflecting mirrors 41 and 42, the isolator 32 is not indispensable. In addition, in this embodiment, the two angle variable reflecting mirrors 41 and 42 and the isolator 32 are disposed, and thus the light path between the convex lens 4 and the grating coupler 22 is increased. However, in this embodiment, light emitted from the convex lens 4 by the semiconductor laser element 1 is converged or parallelized by the convex lens 4. Therefore, similarly to the fourth embodiment, the element size of the grating coupler 22 is not required to be increased, and thus the present invention has a pronounced effect.

Sixth Embodiment

An optical device according to a sixth embodiment of the present invention is different from that in the fourth embodiment in that a semiconductor laser and a grating coupler are configured as an array, but the other structures are the same as the optical device according to the fourth embodiment. That is, a semiconductor laser element (first semiconductor substrate) includes a plurality (herein, four) of integrated laser element units each of which includes the laser unit, the reflecting mirror, and the convex lens. A plurality (herein, four) of integrated waveguide circuit units each of which includes a grating coupler and an optical waveguide, are formed on a silicon substrate 21 (second semiconductor substrate). An isolator 32 is disposed between the first semiconductor substrate and the second semiconductor substrate and over light paths of light, to respectively reach the grating couplers of the integrated waveguide circuit units after having passed through convex lenses of the plurality of integrated laser element units.

Figure 8A:
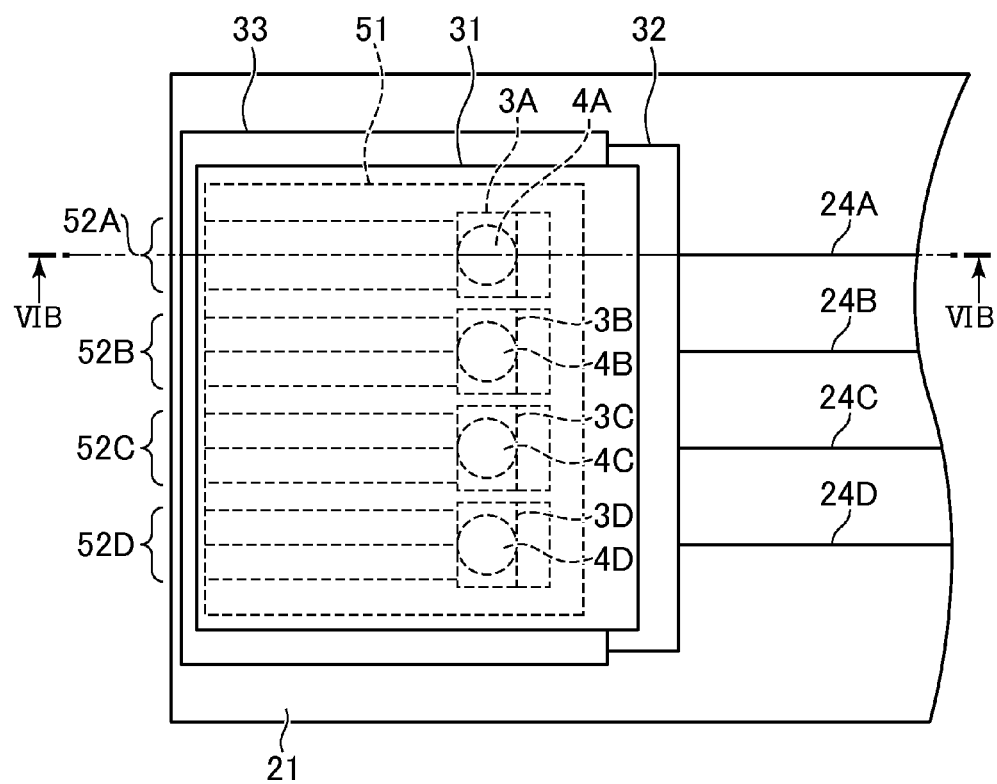
FIG. 8A is a top view of an optical device according to a sixth embodiment of the present invention.
Figure 8B:
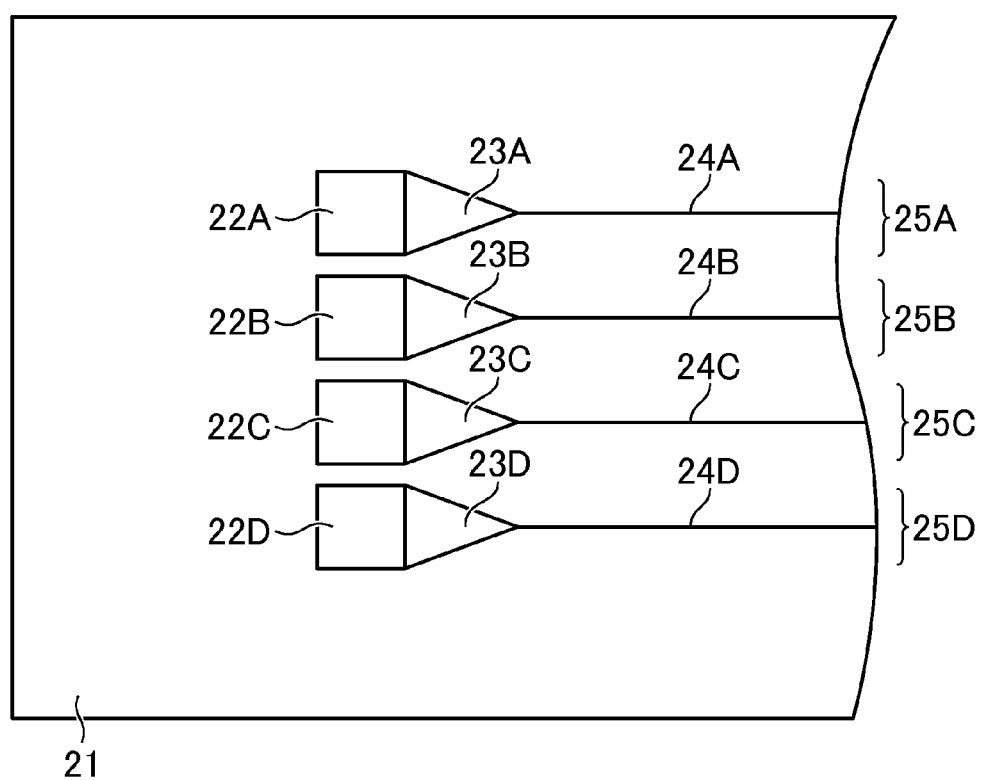
FIG. 8B is a top view of a silicon substrate of the optical device according to the sixth embodiment of the present invention.

FIG. 8A is a top view of the optical device according to this embodiment. FIG. 8B is a top view of the silicon substrate 21 (second semiconductor substrate) of the optical device according to this embodiment. When each of the integrated laser element units including the DFB laser unit, the reflecting mirror, and the convex lens is set to one array, a semiconductor laser element 51 according to this embodiment includes a total of four arrays disposed lined up in a direction (vertical direction) crossing an emission direction of light of the DFB laser unit. When each of the integrated waveguide circuit units, respectively corresponding to the integrated laser element units of the semiconductor laser element 51, which includes the grating coupler and the optical waveguides (first optical waveguide and second optical waveguide) is set to one array, a total of four arrays disposed lined up so as to be along the direction in which the integrated laser element units are disposed lined up are formed on a third surface of the silicon substrate 21. In FIG. 8A, four integrated laser element units 52A, 52B, 52C, and 52D are illustrated together with four DFB laser units, four reflecting mirrors 3A, 3B, 3C, and 3D, and four convex lenses 4A, 4B, 4C, and 4D, but configurations of each of the integrated laser element units are the same as the configurations included in the semiconductor laser element 1 according to any one of the first to third embodiments.

In FIG. 8B, four integrated waveguide circuit units 25A, 25B, 25C, and 25D are illustrated together with four grating couplers 22A, 22B, 22C, and 22D, four first optical waveguides 23A, 23B, 23C, and 23D, and four second optical waveguides 24A, 24B, 24C, and 24D, but configurations of each of the integrated waveguide circuit units are the same as the configurations formed in the silicon substrate 21 according to the first embodiment. Therefore, a cross-section along line VIB-VIB of the optical device according to this embodiment which is illustrated in FIG. 8A is the same as the cross-section of the optical device according to the fourth embodiment which is illustrated in FIG. 6B, except that the reference numerals of the semiconductor laser elements are different from each other.

The (isolator chip of) isolator 32 is disposed over all of four light paths connecting the four convex lenses 4A, 4B, 4C, and 4D and the four grating couplers 22A, 22B, 22C, and 22D, respectively. Here, the number of isolators 32 is one. Thus, even though reflected light propagates in a reverse direction from an optical waveguide on the silicon substrate 21 or an optical member (for example, optical fiber) before the optical waveguide, the one isolator 32 can reduce the reflected light on all the four light paths, and thus the intensity of the reflected light incident on the semiconductor laser element 51 is significantly attenuated, thereby exhibiting an additional effect such as a stabilized oscillation state of the optical device. The interval (distance between central lines of adjacent DFB laser units) among the four DFB laser units is 100 µm. Similarly to the optical device illustrated in FIG. 6B, the isolator 32 is disposed between a laser submount 31 having the semiconductor laser element 51 mounted thereto and the silicon substrate 21. At this time, the number of isolators 32 is one, and the isolator 32 operates as an isolator with respect to the four light paths. The isolator 32 (isolator magnet 34) has a size of 1 mm×1 mm, whereas the centers of the four lenses are separated from each other at a maximum of 300 µm, and the four arrays can share the one isolator 32.

In the optical device according to this embodiment, the four integrated laser element units are integrated in the first semiconductor substrate. The convex lens is formed on a second surface of the first semiconductor substrate, and thus the diameter of the convex lens is 70 µm which is smaller than that of an ordinary glass lens. Therefore, the diameter of the convex lens is smaller than the interval between the DFB laser units, and thus four convex lenses can be disposed lined up, thereby realizing the optical device including four arrays. In this embodiment, a case in which four DFB laser units are included in the semiconductor laser element 51 has been described as an example. However, as long as it is a case in which a plurality (two or more) of DFB laser units are included, the present invention is not limited thereto. The number of isolators may be determined in consideration of the number of arrays to be disposed and the element size of the isolator.

Seventh Embodiment

Figure 9A:
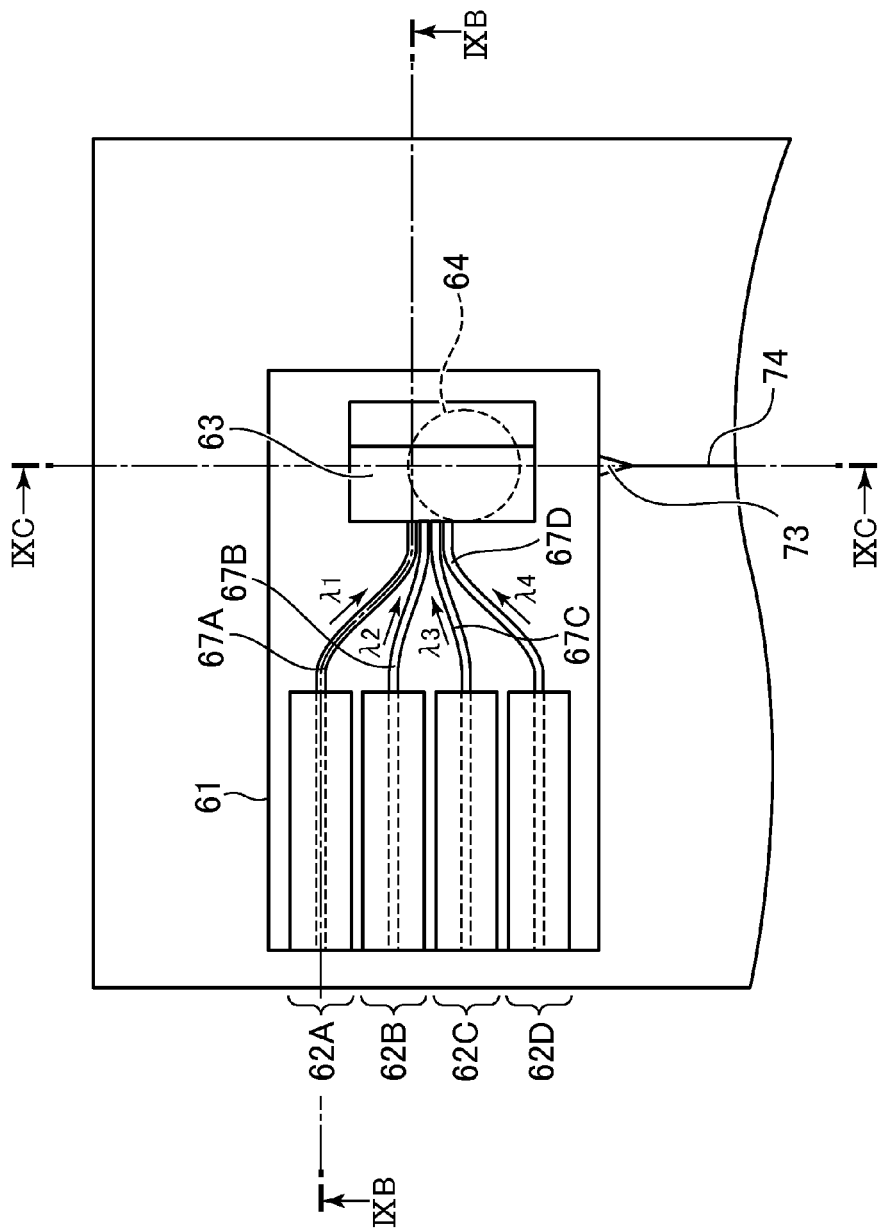
FIG. 9A is a top view of an optical device according to a seventh embodiment of the present invention.

FIG. 9A is a top view of an optical device according to a seventh embodiment of the present invention. The optical device according to this embodiment includes a first semiconductor substrate and a second semiconductor substrate. The first semiconductor substrate (semiconductor laser element 61) includes four DFB laser units 62A, 62B, 62C, and 62D which are disposed lined up in a direction (vertical direction) crossing an emission direction of light, a reflecting mirror 63, a convex lens 64, and four laser optical waveguides 67A, 67B, 67C, and 67D which propagate light beams respectively emitted from the four DFB laser units 62A, 62B, 62C, and 62D and cause the light beams to reach the reflecting mirror 63. Meanwhile, herein, when one DFB laser unit and the laser optical waveguide extending from an end of the DFB laser unit are collectively referred to as an integrated laser element unit, the first semiconductor substrate includes a plurality of the integrated laser element units, the reflecting mirror 63, and the convex lens 64. The interval between the adjacent DFB laser units is 100 µm. The four DFB laser units 62A, 62B, 62C, and 62D emit light beams having a wavelength $\lambda_1$ of 1340 nm, a wavelength $\lambda_2$ of 1320 nm, a wavelength $\lambda_3$ of 1300 nm, and a wavelength $\lambda_4$ of 1280 nm, respectively. That is, the four DFB laser units 62A, 62B, 62C, and 62D emit light beams having different wavelengths. The four laser optical waveguides 67A, 67B, 67C, and 67D extend from ends of the four DFB laser units 62A, 62B, 62C, and 62D, are curved so as to be collected in the reflecting mirror 63 in accordance with the extension thereof, further extend while being lined up at equal intervals, and reach the reflecting mirror 63. That is, the laser optical waveguide is an optical waveguide that propagates the light emitted from the DFB laser unit to the reflecting mirror 63. Here, the interval between two laser optical waveguides adjacent to each other in the vicinity of the reflecting mirror 63 is 2.5 µm which is smaller than that on the DFB laser unit side.

Figure 9C:
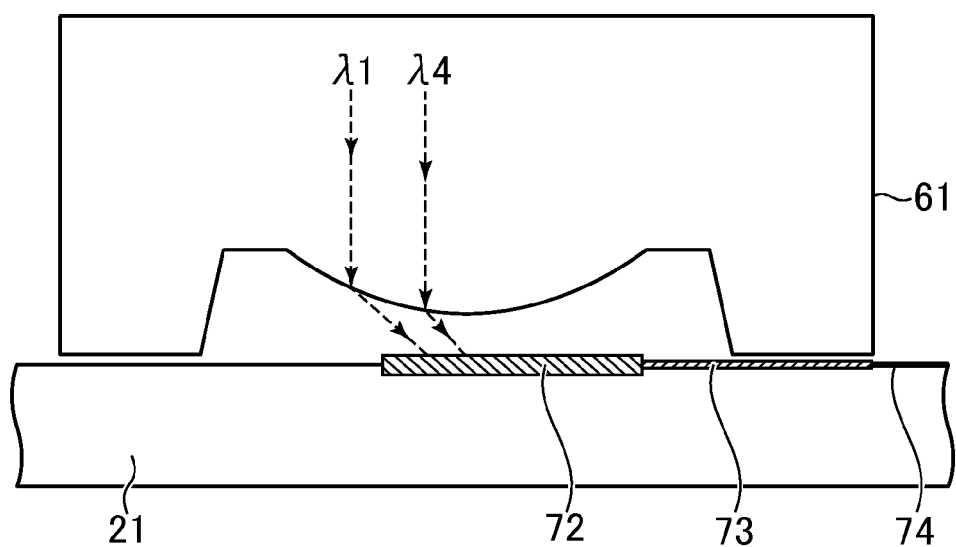
FIG. 9C is a cross-sectional view of the optical device according to the seventh embodiment of the present invention.

FIG. 9B and FIG. 9C are cross-sectional views of the optical device according to this embodiment. FIG. 9B illustrates a cross-section along line IXB-IXB illustrated in FIG. 9A, and FIG. 9C illustrates a cross-section along line IXC-IXC illustrated in FIG. 9A. Meanwhile, the line IXB-IXB illustrated in FIG. 9A is a cross-section that passes through the central line of the DFB laser unit 62A, further passes through the central line of laser optical waveguide 67A to be curved, and further linearly intersects the reflecting mirror 63, and then reaches an end of the optical device. As illustrated in FIG. 9B, the laser optical waveguide 67A is formed in a core layer 66, and thus light propagating through the laser optical waveguide can reach the reflecting mirror 63 with low loss. As illustrated in FIG. 9B, a normal line of a plane of the reflecting mirror 63 obliquely intersects optical axes 4 of four light beams reaching the reflecting mirror 63 at 45 degrees, and the reflecting mirror 63 reflects the four light beams toward a second surface (lower surface). At this time, the optical axes of the four light beams pass through the center of the convex lens 64, are lined up in a straight line along the line IXC-IXC in FIG. 9A, and reach the second surface of the convex lens 64. The optical axes of the four light beams are shifted in order on the opposite side to the optical waveguide side from the center of the convex lens 64, and penetrate the surface of the convex lens 64. The light beam closest to the center of the convex lens 64 is a light beam emitted from the DFB laser unit 62D, propagating through the laser optical waveguide 67D, and then reflected by the reflecting mirror 63, and is set to be 5.5 µm away from the center of the convex lens 64. The four light beams shifted in order from the center of the convex lens 64 are lined up in the order of light beams emitted from the DFB laser units 62D, 62C, 62B, and 62A.

As illustrated in FIG. 9C, similarly to the first embodiment, a grating coupler 72, a first optical waveguide 73, and a second optical waveguide 74 are formed lined up in order on a third surface of the silicon substrate 21, but are lined up in a direction perpendicular to an emission direction of the DFB laser unit rather than in a direction parallel thereto. Thus, the second optical waveguide 74 extends along the direction perpendicular thereto. The four light beams reflected by the reflecting mirror 63 are lined up along the direction perpendicular thereto. In FIG. 9C, in the four light beams, a light beam emitted from the DFB laser unit 62A and propagating and a light beam emitted from the DFB laser unit 62D and propagating are only shown as $\lambda_1$ and $\lambda_4$, respectively, but two light beams emitted from the DFB laser units 62B and 62C and propagating are also actually present between two light beams. The four light beams are incident on positions shifted from the center of the convex lens 64, and consequently, are incident on the grating coupler 72 at different angles. Here, incidence angles $\Theta_{in}$ of the four light beams on the grating coupler 72 are $\Theta_{in}(\lambda_1)$=12.9 degrees, $\Theta_{in}(\lambda_2)$=10.4 degrees, $\Theta_{in}(\lambda_3)$=8 degrees, and $\Theta_{in}(\lambda_4)$=5.6 degrees, respectively, in the order (in the order from the left side to the right side of FIG. 9C) of light beams respectively emitted from the DFB laser units 62A, 62B, 62C, and 62D.

Here, a technique relating to coupling of light in a grating coupler is disclosed in "Frederik Van Laere, et. al., Journal of Lightwave Technology, Vol. 25, No. 1, January 2007, Pages 151-156" and "Christopher R. Doerr et al., IEEE Photonics Technology Letters, Vol. 22, No. 19, Oct. 1, 2010, Pages 1461-1463" (hereinafter, "Doerr"). When a diffraction grating pitch of the grating coupler is set to d, a refractive index of the grating coupler is set to $n_{eff}$(=2.6), a refractive index of air is set to $n_{air}$ (=1), an incidence angle of light is set to $\Theta_{in}$, and a wavelength is set to $\lambda$, the relation may be expressed as $d \cdot n_{eff} + d \cdot n_{air} \cdot \sin \Theta_{in} = \lambda$ (Equation 1). The coupling efficiency of the grating coupler which is expressed by Equation 1 is disclosed in (1) of Doerr, and light having the wavelength $\lambda$ satisfying Equation 1 can be coupled to the grating coupler with the maximum efficiency. Meanwhile, the reason why the sign before sin $\Theta_{in}$ in Equation 1 is "+" is because the definition of an incidence angle $\Theta_{in}$ is different from that of (1) of Doerr, but both the equations are equivalent to each other in terms of expression.

Figure 10:
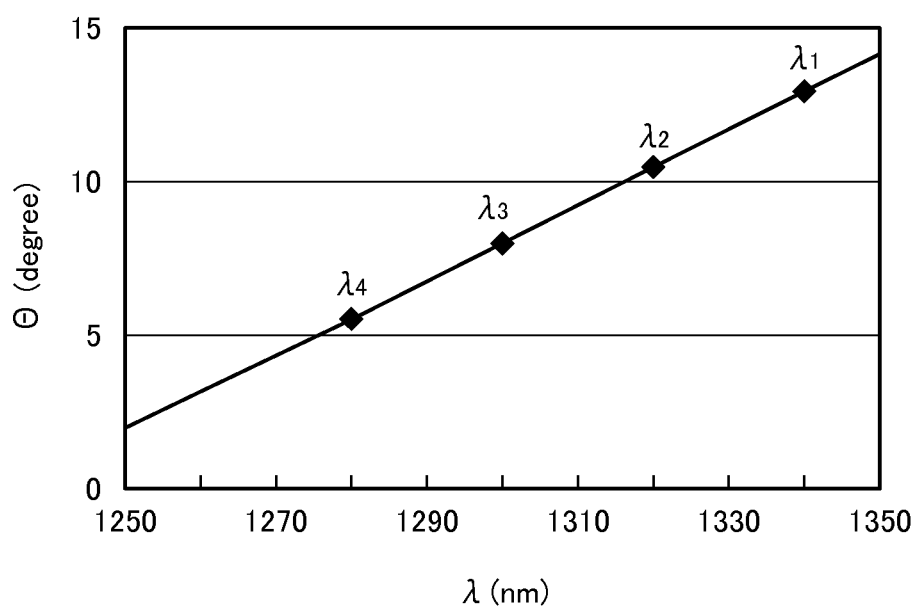
FIG. 10 is a diagram illustrating a relationship between an incidence angle $\Theta_{in}$ of light on a grating coupler and a wavelength $\lambda$.

FIG. 10 is a diagram illustrating a relationship between the incidence angle $\Theta_{in}$ of the light incident on the grating coupler and the wavelength λ. A curve illustrated in FIG. 10 shows a relationship between the incidence angle $\Theta_{in}$ and the wavelength λ based on Equation 1, and the incidence angle $\Theta_{in}$ and the wavelength λ in each of the above-mentioned four light beams substantially satisfies (Equation 1), and thus such four light beams can be coupled to the grating coupler 72 with low loss. The four light beams having different wavelengths and respectively emitted from the four DFB laser units 62D, 62C, 62B, and 62A, which are lined up in ascending order of wavelengths thereof, penetrate the surface of the convex lens 64 at positions shifted from the center of the convex lens 64 in this order, and thus it is possible to cause incidence angles $\Theta_{in}$ of the four light beams incident on the grating coupler to be different from each other, and to cause the incidence angles to be increased in order. Furthermore, the shift from the center is determined so as to substantially satisfy (Equation 1), and thus the four light beams can be coupled to the grating coupler with higher efficiency, thereby exhibiting a pronounced effect. In this embodiment, a case in which four DFB laser units are included in the semiconductor laser element 61 has been described as an example. However, as long as it is a case in which a plurality (two or more) of DFB laser units are included, the present invention is not limited thereto.

As stated above, the optical devices according to the embodiments of the present invention have been described. Although a DFB laser is used as a light source of the semiconductor laser element of the optical device, it is needless to say that the present invention is not limited thereto. For example, a distributed Bragg reflector (DBR) laser may be used, and the light source may be an element in which a laser and a modulator are integrated. Here, the modulator may be an electro-absorption (EA) modulator or an MZ modulator. In addition, in the above embodiment, silicon (Si) used as a material of the second semiconductor substrate (second substrate) has been described as the most preferable example, but it is possible to use silicon glass ($SiO_2$) or a general glass in addition to a semiconductor material such as InP or GaAs. For this reason, the "second semiconductor substrate" in the example is illustrative of the "second substrate", and the second substrate is not limited to a semiconductor substrate.

In addition, the present invention can be widely applied to an optical device including a semiconductor laser, a lens, and a grating coupler.

While there have been described what are at present considered to be certain embodiments of the invention, it will be understood that various modifications may be made thereto, and it is intended that the appended claim cover all such modifications as fall within the true spirit and scope of the invention.

What is claimed is:

1. An optical device comprising:
a first substrate, formed of a semiconductor material and having a first surface and a second surface which is a rear surface of the first surface, the first substrate comprising:
a laser unit, having an active layer laminated between the first surface and the second surface and emitting light into the first substrate from the active layer;
a reflecting mirror, having a plane obliquely intersecting an optical axis of light emitted from the laser unit, provided on the first surface reflecting the light emitted from the laser unit and propagating the light toward the second surface; and
a convex lens, provided in a region on the second surface, the region including an optical axis of the light reflected by the reflecting mirror; and
a second substrate, having a third surface facing the second surface, and being provided with a grating coupler and an optical waveguide on the third surface thereof, the optical waveguide having light incident on the grating coupler propagating therethrough,
wherein the convex lens converges or parallelizes the light reflected by the reflecting mirror so as to cause the light to reach the grating coupler, and
wherein the optical axis of the light reflected by the reflecting mirror is offset by 5 to 18 μm from an optical axis in the center of the convex lens in a direction opposite to the optical waveguide side of the second substrate, and the light reflected by the reflecting mirror penetrates a surface of the convex lens.

2. An optical device according to claim 1, wherein the optical axis of the light reflected by the reflecting mirror is offset by 5 to 14.5 μm with respect to the optical axis in the center of the convex lens.

3. An optical device according to claim 1, wherein the second substrate is formed of any one material of Si, GaAs, InP, and glass.

* * * * *